United States Patent [19]

Iwase

[11] Patent Number: 4,797,530
[45] Date of Patent: Jan. 10, 1989

[54] CERAMIC CIRCUIT SUBSTRATES AND METHODS OF MANUFACTURING SAME

[75] Inventor: Nobuo Iwase, Kamakura, Japan

[73] Assignee: Kabushiki Kaisha Toshiba, Kawasaki, Japan

[21] Appl. No.: 939,969

[22] Filed: Dec. 10, 1986

[30]   Foreign Application Priority Data

Dec. 11, 1985 [JP]   Japan ................................ 60-278154

[51] Int. Cl.$^4$ ............................................. B23K 26/00
[52] U.S. Cl. ................................. 219/121.85; 29/846; 219/121.35
[58] Field of Search ..... 219/121 L, 121 LM, 121 EB, 219/121 EM; 29/846

[56]   References Cited

U.S. PATENT DOCUMENTS 3,056,881  10/1962  Schwarz ........................... 29/846 X
4,395,436   7/1983  Bianchi, et al. ......... 219/121 LM X

FOREIGN PATENT DOCUMENTS 2332839  6/1977  France .
61-136976  6/1986  Japan .
61-156895  7/1986  Japan .

OTHER PUBLICATIONS

European Search Report.

Primary Examiner—C. L. Albritton
Attorney, Agent, or Firm—Foley & Lardner, Schwartz, Jeffery, Schwaab, Mack, Blumenthal & Evans

[57]   ABSTRACT

A ceramic circuit substrate can be manufactured by a method comprising the steps of (i) providing an electrically insulating ceramic substrate; and (ii) irradiating a predetermined region of said ceramic substrate with an energy beam such that at least a portion of said region is rendered conductive.

44 Claims, 4 Drawing Sheets

CERAMIC CIRCUIT SUBSTRATES AND METHODS OF MANUFACTURING SAME

BACKGROUND OF THE INVENTION

The present invention relates to ceramic circuit substrates and to manufacturing methods of ceramic circuit substrates. In particular, this invention relates to the technology for forming conductors such as wires or resistors on the surface of a ceramic material.

With progress in the miniaturization of electronic instruments, ceramic circuit substrates have been used actively. Ceramic circuit substrates are used as hybrid substrates for mounting ICs or ceramic packages. Two methods, namely, the thick film technique and the thin film technique have been principally used in forming conductors on such a substrate. Each of these methods is capable of effecting miniaturization of about 1/10 to ½, relative to what is possible using a printed wiring substrate made of resin.

The thick film technique, which uses the printing method, is suited for manufacturing circuit substrates in large quantity at low cost. However, the thick film technique is not suited for the formation of conductors, such as wires, that have a fine line width.

On the other hand, the thin film technique is useful for forming lines having a width as small as about 1 μm, since it employs the photoetching method. However, a thin film technique forms thin films by vapor deposition and sputtering, so that it is difficult to manufacture circuit substrates in large quantity at low cost.

Hence, it is desired to develop a new method that is capable of forming relatively fine conductive lines while satisfying the desire to manufacture circuit substrates in large quantity at low cost.

Further, both the thick and thin film techniques require a long manufacturing process to form the conductive lines, so that problems frequently arise in connection with the expeditious supply of circuit substrates. Moreover, these techniques involve a liquid process, such as the use of pastes or developing solutions in the photoetching method. The administration of liquid processes is complicated from another point of view, in that it may create environmental problems.

Additionally, there is a need to open holes in order to connect both sides of the circuit substrate.

SUMMARY OF THE INVENTION

Accordingly, it is an object of this invention to provide an improved method of manufacturing ceramic circuit substrates.

Another object of the inventon is to provide an improved method of manufacturing ceramic circuit substrate for forming conductive layers with a fine pattern.

Another object of the invention is to provide an improved method of manufacturing ceramic circuit substrates for forming conductive layers in large quantity at low cost.

Another object of the invention is to provide an improved method of manufacturing ceramic circuit substrates rapidly.

Another object of the invention is to provide an improved method of manufacturing ceramic circuit substrates that makes it possible to manufacture ceramic circuit substrates using a dry process.

Another object of the invention is to provide an improved method of manufacturing ceramic circuit substrates that allows the connection of both sides of the circuit substrate while eliminating the necessity of opening holes through the case.

Another object of the invention is to provide an improved method of manufacturing ceramic circuit substrates which permit a high frequency signal input to a semiconductor chip which is composed thereon.

Another object of the invention is to provide an improved method of manufacturing ceramic circuit substrates which allows a resistor to be formed in the direction of the depth.

In accomplishing the foregoing objects, there has been provided, according to one aspect of the invention, a method of manufacturing ceramic circuit substrates comprising the steps of (i) providing an electrically insulating ceramic substrate; and (ii) irradiating a predetermined region of the ceramic substrate with an energy beam such that at least a portion of the region is rendered conductive. In one preferred embodiment, the conductive portion is substantially resistance-free, while in another preferred embodiment the conductive portion has sufficient resistance to function as a resistor.

There has also been provided, according to another aspect of the invention, a ceramic circuit substrate comprising (A) an electrically insulating ceramic substrate and (B) a conductive region formed at the surface of said ceramic substrate, which conductive region consists essentially of a metallic element formed by reduction of material comprising said ceramic substrate.

BRIEF DESCRIPTION OF THE DRAWINGS

The present invention, together with its various features and advantages, will be readily understood from the more detailed description presented below in conjunction with the following drawings in which.

DETAILED DESCRIPTION OF THE PREFERRED EMBODIMENTS

In the present invention, an electrically insulating ceramic substrate—used as a hybrid substrate for mounting ICs or compassing a ceramic package—is exposed to an energy beam so as to form conductors in the irradiated regions alone by metalization affected through reduction.

Suitable ceramics for this purpose include, for example, nitride ceramics that contain AlN, Si$_3$N$_4$, BN, or other nitrides as the main constituents; carbide ceramics that contain SiC or other carbides as the main constituents; and oxide ceramics that contain BeO or other oxides as the main constituents. In particular, AlN and Si$_3$N$_4$, substances that can be reduced to metals of Al or Si in the regions irradiated with an energy beam, are preferred.

Figure 1:
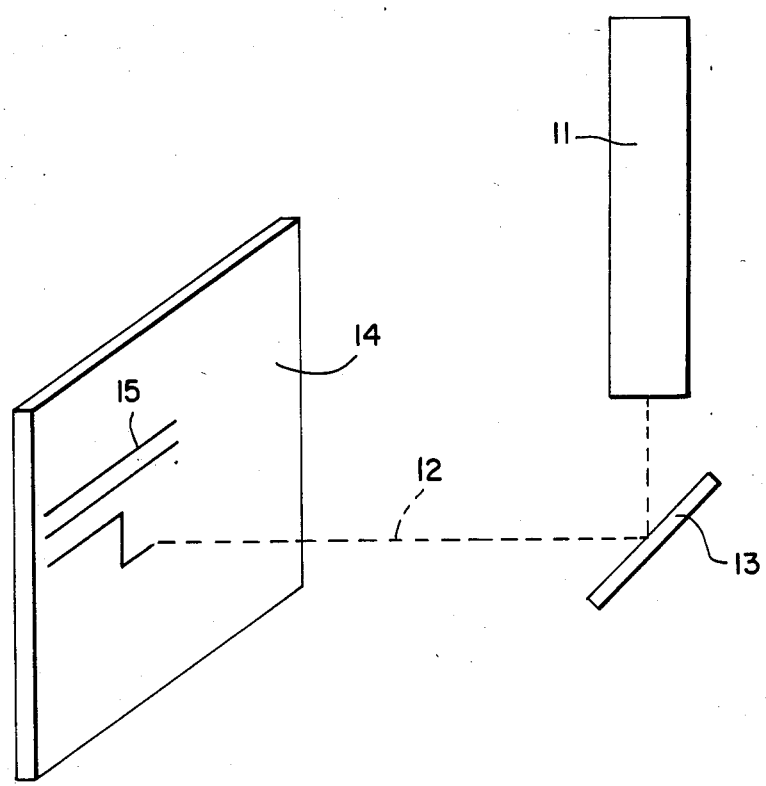
FIG. 1 is a diagram showing a perspective view of an irradiating method of a laser beam to a ceramic substrate.

FIG. 1 is a diagram showing a method for irradiating a ceramic substrate with a laser beam, pursuant to the present invention. A laser oscillator 11 generates a laser beam 12. Then the beam is scanned by controlling the angle of a mirror 13. At the irradiated portion of a ceramic substrate 14, a conductor 15 is formed.

The reaction as shown in Eq. (1) when the ceramic material is a nitride, in Eq. (2) when the ceramic material is a carbide, and in Eq. (3) when the ceramic material is an oxide, is generated, respectively, to deposit a metal by reducing the ceramic material.

$$MeN \rightarrow Me + (\tfrac{1}{2})N_2(g) \quad (1)$$

$$MeC \rightarrow Me + C \quad (2)$$

$$MeO \rightarrow Me + (\tfrac{1}{2})O_2(g) \quad (3)$$

"Me" in these equations denotes a metal. By scanning the laser beam 12, the reduced metal is rendered in a continuous form, creating a conductor 4 which functions, for example, as a conductive line 15 on the ceramic substrate 14, producing a ceramic circuit substrate.

For example, if a ceramic substrate made of AlN is irradiated with a laser beam, a reaction according to Eq. (4) will take place, by which AlN is reduced to generate, theoretically, 80.7% per volume Al, or 65.8 weight percent, from AlN.

$$AlN \rightarrow Al + (\tfrac{1}{2})N_2(g) \quad (4)$$

Moreover, by generating compounds of Al, or by dispositing a large number of fine Al particles that are generated in a composite manner through control of the energy of the laser beam, the affected part can be made to possess a specific resistance that is larger than that of metallic Al, to form a conductor that functions as a resistor.

Various preferred embodiments of the present invention will now be described by reference to the following, illustrative examples.

EXAMPLE 1

Figure 2:
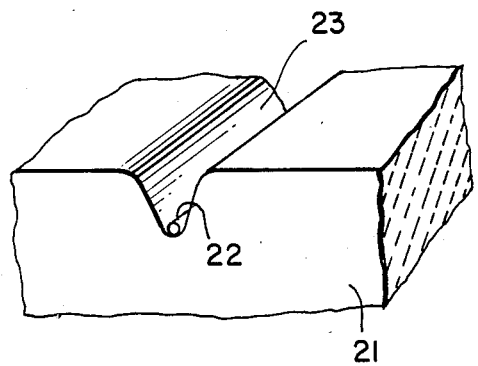
FIG. 2 is a diagram showing a perspective view of an embodiment of the invention, the diagram showing a metal region formed on a ceramic substrate.

With reference to FIG. 2, an AlN substrate 21, with dimensions of 20×10×0.635 (mm), was prepared by the hot press sintering of raw material powder of high purity AlN. The AlN substrate was then irradiated with an Nb$^{3+}$—YAG laser (Q-switch) beam having a spot diameter of 400 μm. The irradiation was performed in air. The irradiation conditions were 1 ms-width pulses at 10 pps (pulses per second), and the energy per pulse was 5J. By scanning the laser beam at 5 mm/s, metallic Al, substantially resistance-free conductive path 22 was formed in a groove 23 hat was formed during irradiation of AlN substrate 21 as shown in FIG. 2.

EXAMPLE 2

Figure 3:
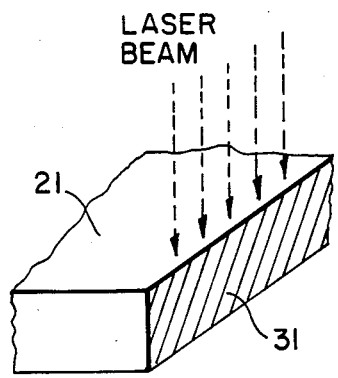
FIG. 3 is a diagram showing a perspective view of another embodiment of the invention, in which a metal region is produced at the cross-section of a ceramic substrate.

According to this embodiment of the present invention, the same laser beam as in Example 1 was employed, but with the energy raised to 10 J/pulse so that, by moving the beam, the laser was made to cut. By means of this irradiation, metallic Al 31 was reduced to form a planar conductive layer on the cut surface, as shown in FIG. 3. Such a planar conductive surface 31, for example, can be used for the connection between a ground pad (not shown) formed on the front surface and a ground electrode layer (not shown) formed on the back surface of the ceramic circuit substrate.

EXAMPLE 3

An AlN substrate having the dimensions of 60×30×0.635 (mm) and containing 3 weight-percent of Y$_2$O$_3$ was formed by sheet molding and atmospheric-pressure sintering. The AlN substrate was then irradiated by scanning with CO$_2$ laser beam at 2.5 mm/s in air, with a beam spot diameter of 100 μm under the condition of 10 J/pulse and 1000 pps, to form reduced metallic Al, as conductive paths with small specific resistance, in the laser beam scanned portions of the AlN substrate. The resistivity of the paths thus obtained was determined via the four-probe method to be about 2.2 Ω/cm, i.e. the paths were substantially resistance-free. The substrate was then given a heat treatment at 650° C. in a N$_2$ atmosphere (the value of oxygen is 20 ppm). Consequently, the resistivity was reduced to 2.0 Ω/cm.

EXAMPLE 4

First, an AlN substrate having dimensions of 60×30×0.635 (mm) and containing 5 weight-percent of Y$_2$O$_3$ was formed by sheet molding and atmospheric pressure sintering. The AlN substrate was then scanned in air, at a speed of 4 mm/sec, with a beam (50 mm spot diameter) from a YAG laser (Toshiba: LAY 711), which is conventionally used for resistor trimming. The conditions of the laser beam were: an exiting current of 14A, a frequency of 2 KHz and a bite size of 2 μm. As a result, a groove was formed on the AlN substrate, as well as a conductive path (resistor) of 500 Ω/cm at the bottom portion of that same groove. Furthermore, the depth and the width of the groove was measured with a scanning electron microscope to be 70 μm, respectively. In this embodiment of the present invention, the conductive path of reduced, metallic material served as a resistor because of the relatively low power of the laser.

EXAMPLE 5

After soaking an AlN substrate containing 3 weight percent of Y$_2$O$_3$ in an aqueous solution of 10 weight percent of KOH, a Nb$^{3+}$—YAG laser (Q-switch) beam with spot diameter of 100 μm was scanned at 10 mm/sec. A resistor of 1K Ω/cm was thereby formed on the AlN substrate. The conditions of laser irradiation were: 1 ms pulse width, 10 pps and 5 J/pulse.

EXAMPLE 6

By scanning a Nb$^{3+}$—YAG laser (Q-switch) characterized by 5 J/pulse, a 1 ms pulse width, a spot diameter of 500 μm and a pitch of 300 μm, while Q-switching, in air onto an AlN substrate (prepared by hot press sintering), a thin Al film was formed over the entire surface of the AlN substrate. The scanning speed was 5 mm/s.

This layer could be used, for example, as a ground electrode layer on the back surface of a ceramic circuit substrate.

EXAMPLE 7

When a $Si_3N_4$ ceramic substrate prepared by hot press sintering was irradiated in air with a $Nb^{3+}$—YAG laser (Q-switch) beam having a spot diameter of 400 μm, a groove was formed in the $Si_3N_4$ substrate. At the same time, an outermost layer of $SiO_2$, a Si polycrystalline intermediate layer and an inner layer of metallic Si wire was formed in the groove. The laser beam conditions were 1 ms pulse width, 5 J/pulse and 10 pps. The scanning speed was 5 mm/s.

EXAMPLE 8

Figure 4A:
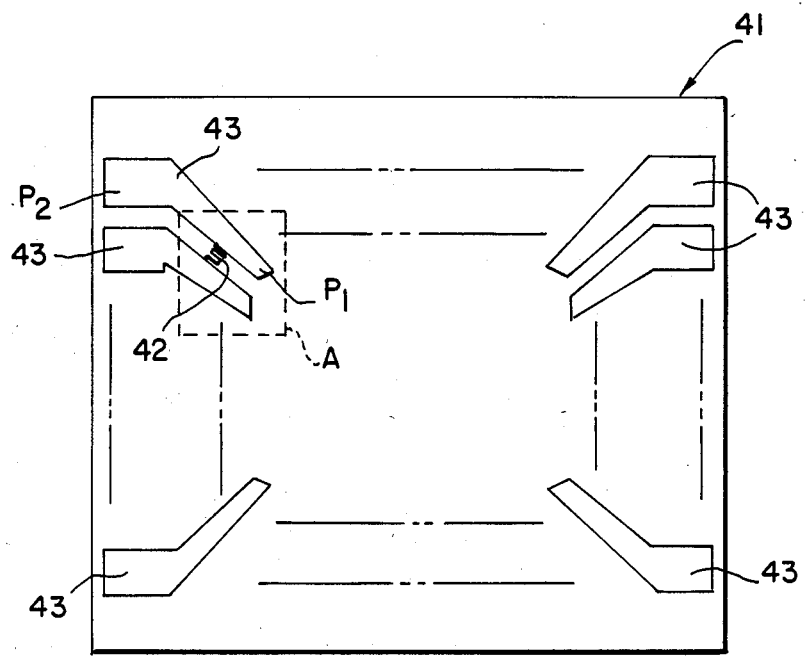
FIG. 4a is a diagram showing a plan view of another embodiment of the present invention, in which a plurality of metal layers and a resistor formed therebetween are fabricated on a ceramic substrate.
Figure 4B:
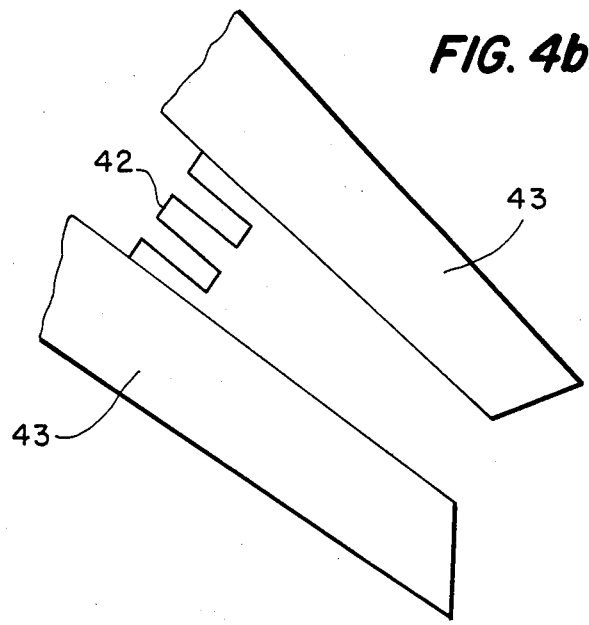
FIG. 4b is a diagram showing an enlarged plan view of FIG. 4a, and FIG. 4c is a diagram showing a similar plan view but with an GaAs IC chip attached onto the ceramic circuit substrate.

First, as shown in FIG. 4a, an AlN substrate 41 with dimensions of 15×15×0.5 (mm) and a thermal conductivity of 120 W/m·k was prepared. A prescribed portion of the AlN substrate 41 was irradiated by being scanned at 10 mm/S in air with an $Nb^{3+}$—YAG laser (Q-switch) beam, spot diameter of 400 μm, under the conditions of 5.2 J/pulse, 1 ms pulse width and 10 pps. As a result, a resistor 42 was formed. Subsequently, a thick film of Au paste (Du Pont Co. 9791) was applied all over the back surface of the AlN substrate 41 (not shown). In addition, a plurality of conductor patterns 43 (width of about 0.6 mm), each having a characteristic impedance of about 50Ω, were printed on the front surface using the same paste. After drying the substrate for 10 minutes at 120° C., it was sintered in air for 10 minutes at 850° C. By these treatments, as shown in FIG. 4a, there was formed a substrate for the ceramic package which had a plurality of conductors 43 and a resistor 42 (45Ω; reflection coefficient of −0.048). More specifically, as shown in FIGS. 4a and 4b, resistor 43 is formed between two selected conductors 42; one of the two conductors 42 is for a ground voltage supply, the other for a clock supply. The ends $P_1$ of conductors 42 in the center region of the AlN substrate 41 were used as wire bonding pads, while the other ends $P_2$ were also used as connecting pads for external contacts.

Figure 4C:
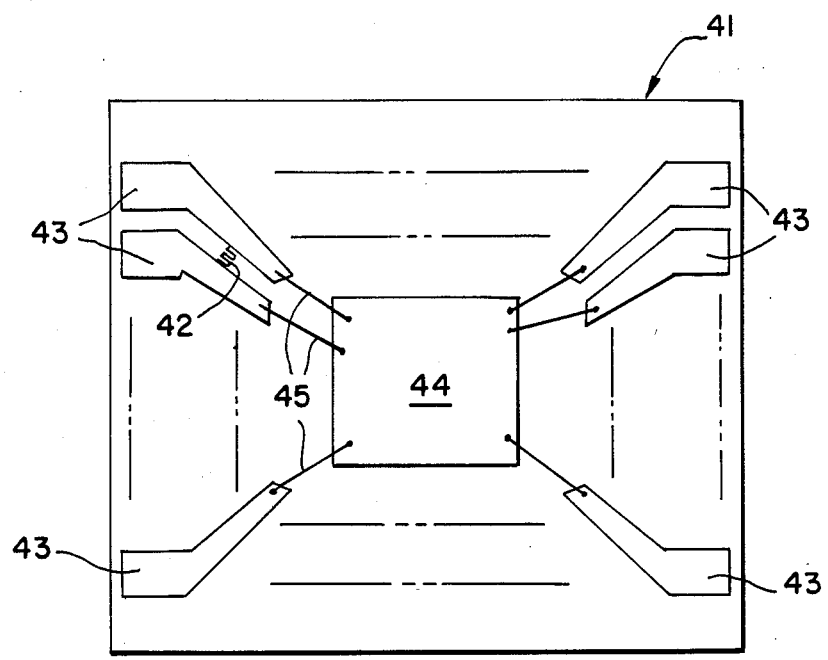

A GaAs IC gate array 44 with 2K gates was die bonded to the front center of the substrate 41, as shown in FIG. 4c, and the bonding pads of the GaAs IC gate array 44 and the conductors 43 of the substrate 41 were bonded with wires 45. With this arrangement, it was confirmed that an operation with characteristics that are similar to those achieved via conventional external attachment of a matching chip resistor could be effected, even when the clock frequency was increased by about 10 percent. This is because the resistor was provided near the GaAs IC gate array 44.

EXAMPLE 9

First, an AlN substrate 51 with the dimensions of 15×15×0.5 (mm) and a thermal conductivity of 120 W/m·k was prepared, and a prescribed portion in the front of the AlN substrate was irradiated in air with an $Nb^{3+}$—YAG laser (Q-switch) beam having a spot diameter of 400 μm at 10 J/pulse. The entire back surface of the AlN substrate 51 was then coated with a thick film 52 of Au paste, and a plurality of conductor patterns 53 (width of about 0.6 mm), each having a characteristic impedance of 50Ω, were printed on the front surface. After drying for 10 minutes at 120° C., the substrate was sintered in air for 10 minutes at 850° C. With these treatments, as shown in FIG. 5, a substrate for a ceramic package was manufactured that had a ground electrode layer 52 on the back surface of the AlN substrate 51, a plurality of conductors 53 on the front surface (corresponding to conductors 43 in FIGS. 4a to 4c), and a resistor 54 (with a resistance of about 45Ω) that was formed on the inner peripheral surface of a fine hole 55 which connected one of the conductors 53, a clock input conductor, to the ground electrode layer 52.

Figure 5:
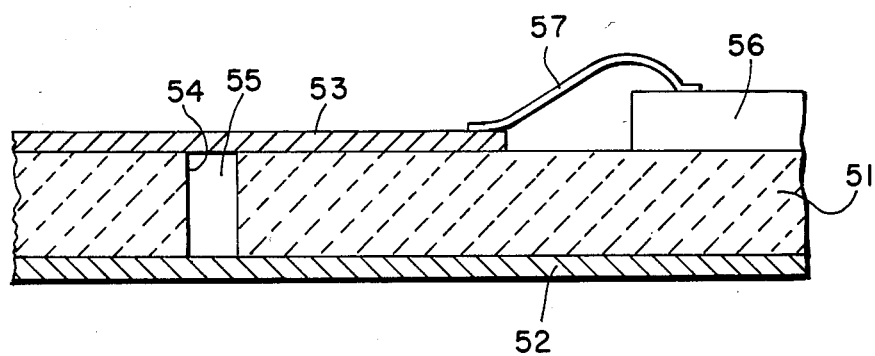
FIG. 5 is a diagram showing a cross-sectional view of another embodiment of the present invention, a resistor being formed in a ceramic circuit substrate.

With the front center of the AlN substrate 51 thus obtained, a GaAs IC gate array 56 with 2k gates was die bonded, that is, the bonding pads of the GaAs IC gate array 56 and the conductors 53 of the substrate 51 were bonded with wires 57, as shown in FIG. 5. As in Example 8, it was confirmed that an operation could be carried out which had characteristics similar to those achieved with external attachment of a matching chip resistor, even when the clock frequency was increased by about 10 percent.

EXAMPLE 10

Figure 6A:
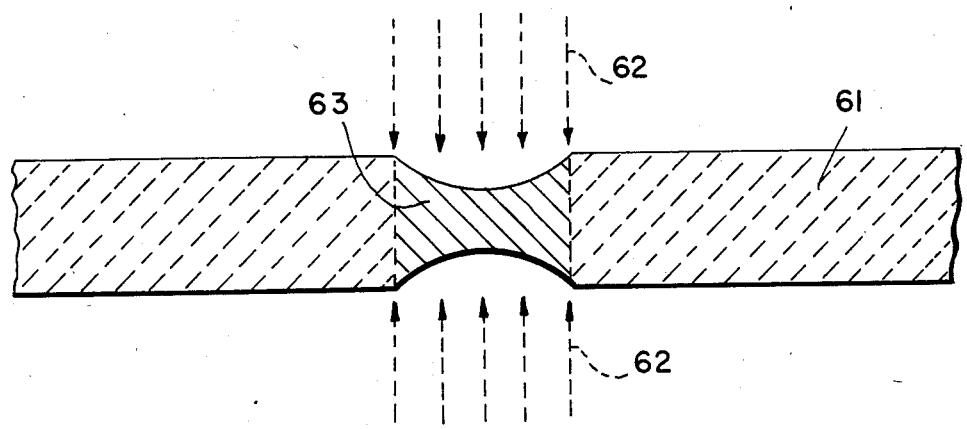
FIG. 6a and FIG. 6b are diagrams showing cross-sectional views of another embodiment of the present invention. The diagrams depict the steps of manufacturing a contact region connecting both sides of a ceramic circuit substrate.

First, the front and the back surfaces of an AlN substrate 61 with a thickness of 0.635 mm and a thermal conductivity of 170 W/m·k, as shown in FIG. 6a, were irradiated three times in air with a $Nb^{3+}$—YAG laser (Q-switch) beam 62 having a spot diameter of 400 μm. The conditions of the laser beam used were: 3 J/pulse and 1 ms pulse width. Upon irradiation with laser beam 62 as described above, a melted portion with a diameter of about 0.3 mm was formed in the irradiated region of the AlN substrate 61, forming metallic Al. A connector 63 was thereby formed (see FIG. 6a). The resistance of connector 63 in the vertical direction was measured and found to be about 0.3Ω.

Figure 6B:
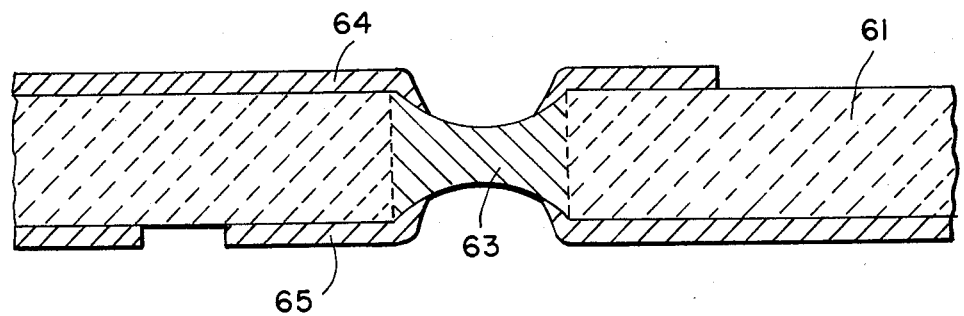

Next, after printing conductor patterns 64 and 65, respectively, on the front and back surfaces of the AlN substrate 61 by the use of a thick film of Au paste, the substrate was dried in air for 10 minutes at 120° C. and sintered in air for 10 minutes at 850° C. As a result, a ceramic circuit substrate was manufactured having upper wires 64 and lower wires 65 contacted via the connector 63, as shown in FIG. 6b.

As described in detail in the foregoing examples, it is possible to manufacture ceramic circuit substrates that possess various properties, including the following:

(1) It is possible to form substantially resistance-free conductive pathways, resistors and other elements with a fine width, directly onto an electrically insulating ceramic material; this makes it possible to obtain a high density circuit substrate.

(2) It is possible to obtain circuit substrates in large quantity and inexpensively by means of a simple process.

(3) The rapid supply of ceramic circuit substrate can be achieved.

(4) It is possible to form conductors by a dry process, which simplifies carrying out the process and eliminates the possibility of creating environmental problems.

(5) When applied to the manufacture of substrate for a given ceramic package, it is possible to form with ease a matching resistor, controlled to a predetermined value, which is located in the vicinity of the IC to be mounted and which has improved characteristics.

(6) When the present invention is applied to the manufacture of a circuit substrate to be connected between both sides, it is possible easily to form fine connectors that do not penetrate the substrate and that have a size approximately equal to the spot diameter of the energy beam. Since the connector does not penetrate the ceramic substrate, a reduction in the strength of the ceramic substrate can be avoided during the formation of these connectors, even with high density.

(7) A resistor formed in the direction of a substrate depth can be manufactured.

The present invention is not restricted to the embodiments described above. For instance, other ceramic substrates, such as BN, SiC, BeO and so forth, can be used instead of AlN and $SI_3N_4$. Other energy beams, such as those produced by an Ar laser, a filament lamp light and a gas discharge light, electron beams and others can also be used for the above-described purposes.

In the Examples 8 and 9, moreover, the resistor was formed between the ground voltage supply and the clock input. However, the resistor may be formed between the ground voltage supply and another signal input. Furthermore, the present invention can be applied when bonding pads, to which bonding wires are die bonded, are formed by the energy beam irradiation in the same manner described in the preceding examples. The scanning of the energy beam can also be altered or eliminated by moving the ceramic substrate itself.

Other modifications and improvements of the invention will also become apparent to those of skill in the art, and the invention is intended to cover such modifications and improvements as defined by the appended claims.

What is claimed is:

1. A method of manufacturing ceramic circuit substrate, comprising the steps of:
   (i) providing an electrically insulating ceramic substrate that is comprised of at least one material selected from the group consisting of aluminum nitride and silicon nitride; and
   (ii) irradiating a predetermined region of said ceramic substrate with an energy beam such that at least a portion of said region is rendered conductive.

2. A method as claimed in claim 1, wherein said irradiating converts said portion of said ceramic substrate to a metallic form.

3. A method as claimed in claim 1, wherein the irradiated position of said ceramic substrate is moved during step (ii).

4. A method as claimed in claim 1, wherein said energy beam is a laser beam.

5. A method as claimed in claim 1, wherein said conductor portion is formed in a groove of said ceramic substrate, said groove being formed by said irradiating of said ceramic substrate during step (ii).

6. A method as claimed in claim 1, wherein said conductive portion is substantially resistance-free.

7. A method as claimed in claim 1, wherein said conductive portion is a resistor.

8. A method as claimed in claim 1, wherein step (ii) comprises cutting said ceramic substrate to form a surface on which said conductive portion is provided.

9. A method as claimed in claim 8, wherein said surface extends the width of said ceramic substrate.

10. A method as claimed in claim 1, further comprising the step of forming a plurality of conductors distinct from said conductive portion on said ceramic substrate, wherein at least two conductors of said plurality are connected by said conductive portion.

11. A method as claimed in claim 10, wherein said two conductors are for signal input and for ground supply voltage, respectively, and said conductive portion is a resistor therebetween.

12. A method as claimed in claim 1, wherein a passage through said ceramic substrate is formed by said irradiating and said conductive portion is provided on inner wall of said passage.

13. A method as claimed in claim 12, further comprising the step of forming conductors on the front and back surface of said ceramic substrate, such that the conductor on the back surface of said ceramic substrate is connected by said conductive portion to the conductor on the front surface.

14. A method as claimed in claim 1, wherein said conductive portion penetrates the thickness of said irradiated region.

15. A method as claimed in claim 14, wherein step (ii) comprises irradiating both the front and back surfaces of said ceramic substrate.

16. A method as claimed in claim 14, further comprising the step of forming conductors on front and back surfaces of said ceramic substrate, respectively, said conductors being connected to each other by said conductive portion penetrating said region.

17. A ceramic circuit substrate, comprising:
   an electrically insulating ceramic substrate that is comprised of at least one material selected from the group consisting of aluminum nitride and silicon nitride; and
   a conductive region formed at the surface of said ceramic substrate, said conductive region consisting essentially of a metallic element formed by reduction of material comprising said ceramic substrate.

18. A method as claimed in claim 1, wherein said ceramic substrate comprises a front surface and a back surface.

19. A method as claimed in claim 18, wherein said ceramic substrate consists essentially of at least one material selected from the group consisting of aluminum nitride and silicon nitride.

20. A method as claimed in claim 19, wherein said material is aluminum nitride.

21. A method as claimed in claim 20, wherein said irradiating step is capable of converting said portion into a metallic form.

22. A method as claimed in claim 20, wherein said irradiated position of said ceramic substrate is moved during step (ii).

23. A method as claimed in claim 20, wherein said energy beam is a laser beam.

24. A method as claimed in claim 20, wherein said step (ii) is capable of producing a groove in said ceramic substrate and said conductive portion is formed in the groove.

25. A method as claimed in claim 20, wherein said conductive portion is substantially resistance-free.

26. A method as claimed in claim 20, wherein step (ii) further comprises cutting said ceramic substrate to produce a surface on which said conductive portion can be formed.

27. A method as claimed in claim 26, wherein said surface extends the width of the ceramic substrate.

28. A method as claimed in claim 20, further comprising the step of
   (iii) forming on said ceramic substrate, a plurality of conductors distinct from said conductive portion, wherein at least two of said conductors are connected by said conductive portion.

29. A method as claimed in claim 28, wherein one of said two conductors is used for signal input and the other of said two conductors is used for ground supply voltage, and said conductive portion is a resistor therebetween.

30. A method as claimed in claim 20, wherein said step (ii) is capable of producing through said ceramic substrate a passage comprising an inner wall and said conductive portion is provided on said inner wall.

31. A method as claimed in claim 30, further comprising the step of
(iii) forming conductors on both the front and back surfaces of said ceramic substrate, wherein at least one conductor on the back surface is connected by said conductive portion to at least one conductor on the front surface.

32. A method as claimed in claim 20, wherein said conductive portion penetrates the thickness of the irradiated region.

33. A method as claimed in claim 32, wherein step (ii) comprises irradiating both the front and back surfaces of said ceramic substrate.

34. A method as claimed in claim 32, further comprising the step of
(iii) forming on said front and back surfaces of said ceramic substrate, a plurality of conductors distinct from said conductive portion, wherein at least two of said conductors are connected by said conductive portion.

35. A method as claimed in claim 19, wherein said ceramic substrate consists essentially of silicon nitride.

36. A method as claimed in claim 35, wherein said irradiating step is capable of converting said portion into a metallic form.

37. A method as claimed in claim 35, wherein said irradiated position of said ceramic substrate is moved during step (ii).

38. A method as claimed in claim 35, wherein said energy beam is a laser beam.

39. A method as claimed in claim 35, wherein said step (ii) is capable of producing a groove in said ceramic substrate and said conductive portion is formed in the groove.

40. A ceramic circuit substrate as claimed in claim 17, wherein said ceramic substrate consists essentially of at least one material selected from the group consisting of aluminum nitride and silicon nitride.

41. A ceramic circuit substrate as claimed in claim 40, wherein said ceramic substrate consists essentially of aluminum nitride.

42. A ceramic circuit substrate as claimed in claim 40, wherein said ceramic substrate consists essentially of silicon nitride.

43. A method as claimed in claim 1, wherein said material is aluminum nitride.

44. A method as claimed in claim 1, wherein said material is silicon nitride.

* * * * *